United States Patent
Yong et al.

(10) Patent No.: US 12,520,582 B2
(45) Date of Patent: Jan. 6, 2026

(54) MANUFACTURING METHOD OF ARRAY SUBSTRATE, AND DISPLAY PANEL

(71) Applicants: CHUZHOU HKC OPTOELECTRONICS TECHNOLOGY CO., LTD., Chuzhou (CN); HKC CORPORATION LIMITED, Shenzhen (CN)

(72) Inventors: Wanfei Yong, Chuzhou (CN); En-Tsung Cho, Chuzhou (CN); Yuming Xia, Chuzhou (CN); Sihui Yu, Chuzhou (CN)

(73) Assignees: CHUZHOU HKC OPTOELECTRONICS TECHNOLOGY CO., LTD., Chuzhou (CN); HKC CORPORATION LIMITED, Shenzhen (CN)

( * ) Notice: Subject to any disclaimer, the term of this patent is extended or adjusted under 35 U.S.C. 154(b) by 491 days.

(21) Appl. No.: 18/008,430

(22) PCT Filed: Dec. 30, 2021

(86) PCT No.: PCT/CN2021/142901
§ 371 (c)(1),
(2) Date: Dec. 5, 2022

(87) PCT Pub. No.: WO2022/188519
PCT Pub. Date: Sep. 15, 2022

(65) Prior Publication Data
US 2023/0230984 A1    Jul. 20, 2023

(30) Foreign Application Priority Data

Mar. 9, 2021    (CN) .......................... 202110254434.4

(51) Int. Cl.
*H10D 86/01*    (2025.01)

(52) U.S. Cl.
CPC .............................. *H10D 86/0231* (2025.01)

(58) Field of Classification Search
None
See application file for complete search history.

(56) References Cited

U.S. PATENT DOCUMENTS

| | | | |
|---|---|---|---|
| 5,219,787 A * | 6/1993 | Carey | H05K 3/0032 |
| | | | 257/E21.578 |
| 2007/0164330 A1 | 7/2007 | Jeong et al. | |

(Continued)

FOREIGN PATENT DOCUMENTS

| | | |
|---|---|---|
| CN | 101097381 A | 1/2008 |
| CN | 101685229 A | 3/2010 |

(Continued)

OTHER PUBLICATIONS

Haitao Wu, the International Searching Authority written comments, Mar. 2022, CN.

(Continued)

*Primary Examiner* — Michael Lebentritt

(57) ABSTRACT

A manufacturing method of an array substrate and a display panel are disclosed. The manufacturing method includes: disposing a photoresist on an active switch; disposing a protective layer on the active switch; disposing a pixel electrode layer on the protective layer. The step of etching each film layer material based on the photoresist to form an active switch includes: performing a first wet etching on the active switch; performing a first dry etching and two ashing treatments on the active switch; performing a second wet etching on the active switch; and removing the photoresist. The present application can improve the issue of photoresist residues.

16 Claims, 14 Drawing Sheets

(56) References Cited

U.S. PATENT DOCUMENTS

| | | | | |
|---|---|---|---|---|
| 2009/0061632 A1* | 3/2009 | Summerfelt | ...... | H01L 21/31111 |
| | | | | 438/694 |
| 2011/0143532 A1* | 6/2011 | Bai | ...... | H01L 21/76816 |
| | | | | 438/669 |
| 2011/0273639 A1* | 11/2011 | Xie | ...... | G02F 1/136286 |
| | | | | 349/43 |

FOREIGN PATENT DOCUMENTS

| | | | | |
|---|---|---|---|---|
| CN | 106684037 A | 5/2017 | | |
| CN | 106847742 A | 6/2017 | | |
| CN | 107591415 A | 1/2018 | | |
| CN | 107591416 A | 1/2018 | | |
| CN | 110335871 A | 10/2019 | | |
| CN | 110854068 A | 2/2020 | | |
| CN | 110854134 A | 2/2020 | | |
| CN | 113241323 A | 8/2021 | | |
| WO | WO-2019169740 A1* | 9/2019 | ........... | G02F 1/1362 |

OTHER PUBLICATIONS

Haitao Wu, the International Search Report, Mar. 2022, CN.
Wu, Haitao, the ISA written comments, Mar. 2022, CN.
Wu, Haitao, the International Search Report, Mar. 2022, CN.

* cited by examiner

MANUFACTURING METHOD OF ARRAY SUBSTRATE, AND DISPLAY PANEL

CROSS-REFERENCE TO RELATED APPLICATIONS

This application is a United States national stage application of co-pending International Patent Application Number PCT/CN2021/142901, filed Dec. 30, 2021, which claims the benefit and priority of Chinese patent application number CN202110254434.4, entitled "Manufacturing Method of Array Substrate, and Display Panel" and filed with China National Intellectual Property Administration on Mar. 9, 2021, the entire contents of which are incorporated herein by reference.

TECHNICAL FIELD

This application relates to the field of display technology, and more particularly relates to a manufacturing method of an array substrate and a display panel.

BACKGROUND

The statements herein are intended for the mere purpose of providing background information related to the present application and do not necessarily constitute prior art.

Thin-film transistor liquid crystal display (TFT-LCD) is a technology that ingeniously combines microelectronics technology and liquid crystal display technology, in which TFT acts as a pixel switch, controlling the rotation of the liquid crystals to present different colors. The production of TFT consists in the deposition of thin film various layers, mainly including gate metal, gate insulating layer, active layer, ohmic contact layer, source-drain metal, passivation layer, and pixel electrode. The manufacturing processes of various thin film layers include: thin film deposition (PVD or CVD), yellow light (coating, exposure and development of photoresist), etching, etc., in which the yellow light process is a very important process that affects the size of each film layer that is finally created.

Currently, the mainstream TFT (Thin Film Transistor) manufacturing process adopts the 4MASK process. That is, after continuous deposition of various film layers, the photoresist is formed by the half-tone mask technology, and the 2W2D etching process (abbreviation for two wet etching processes and two wet and dry etching processes) is used etch each film layer to form a TFT. The exposure process of the halftone mask technology makes it difficult to control the thickness of the photoresist in the TFT channel region. If the thickness of the photoresist is too thin, it will result in a residue of the ohmic contact layer in the subsequent etching. Otherwise, if the thickness of the photoresist is too large, the subsequent 2W2D etching process cannot achieve complete and thorough etching, so that there would be a residue of the photoresist, resulting in abnormal dimensions of the channel region. In severe cases, the channel region cannot be formed, which seriously affects the display performance.

SUMMARY

In view of the above problems, it is therefore a purpose of this application to provide a method for manufacturing an array substrate and a display panel to improve the problem of photoresist residues.

The present application discloses a method for manufacturing an array substrate, including the following operations:

providing a first substrate; providing a first photomask, and disposing a plurality of film layers of an active switch on the first substrate; providing a second photomask, and disposing a photoresist on the active switch, and creating the active switch by etching each film layer material based on the photoresist; providing a third photomask, and arranging a protective layer on the active switch; and providing a fourth photomask and disposing a pixel electrode layer on the protective layer;

The operations of providing a second photomask, disposing a photoresist on the active switch, and etching each film layer material based on the photoresist to form the active switch include: performing a first wet etching process on the active switch, performing a first dry etching process and two ashing treatments on the active switch, and performing a second wet etching process on the active switch, performing a second dry etching process on the active switch, and stripping the photoresist.

The present application further discloses a method for manufacturing an array substrate, including the following operations:

providing a first substrate;
providing a first photomask to form a gate electrode on the first substrate;
forming a gate insulating material layer, an active material layer, an ohmic contact material layer, a second metal material layer, and a photoresist material layer in sequence on the gate electrode;
providing a second photomask and forming a U-shaped photoresist pattern with a thickness of 1.4 um-1.6 um corresponding to the source and drain positions and a thickness of 0.4 um-0.6 um corresponding to the channel region on the second metal material layer, and further forming an active switch by etching the active material layer, the ohmic contact material layer and the second metal material layer based on the photoresist pattern;
providing a third photomask to forming a protective layer on the active switch; and
providing a fourth photomask, and arranging a pixel electrode layer on the protective layer;
wherein the operations of providing a second photomask and forming a U-shaped photoresist pattern with a thickness of 1.4 um-1.6 um corresponding to the source and drain positions and a thickness of 0.4 um-0.6 um corresponding to the channel region on the second metal material layer, and further forming an active switch by etching the active material layer, the ohmic contact material layer and the second metal material layer based on the photoresist pattern comprise:
performing a first wet etching on the second metal material layer, and etching away the portions of the second metal material layer that are not covered by the photoresist;
performing a first ashing treatment on the photoresist, wherein oxygen is used as the ashing gas, oxygen is introduced at a flow rate of 8000 Scc/min, and the ashing treatment is performed for 20 s to thin the photoresist by 0.15 um-0.25 um to flatten the photoresist channel;
performing a first dry etching on the active material layer, and etching away the portions of the active material layer that are not covered by the photoresist;
performing a second ashing treatment on the photoresist, wherein a mixed gas of oxygen and sulfur hexafluoride is used as the ashing gas, where oxygen is introduced at a flow rate of 8000 Scc/min, sulfur hexafluoride is introduced at a flow rate of 100 Scc/min and the ashing treatment is performed for 15 s to reduce the overall thickness of the photoresist by 0.25 um-0.35 um, so that the portion of the photoresist corresponding to the channel region is etched away to expose the second metal material layer in the channel region;

performing a second wet etching on the second metal material layer to form a source electrode and a drain electrode oppositely arranged across the channel region;

performing a second dry etching on the active material layer and the ohmic contact material layer, etching away the portion of the ohmic contact material layer corresponding to the channel region of to form an ohmic contact layer, and simultaneously etching the portion of the active material layer corresponding to the channel position to form a groove thus creating an active layer; and removing the photoresist;

wherein the second metal material layer has a three-layer structure, where the bottom layer is a molybdenum metal layer, the middle layer is an aluminum metal layer, and the top layer is a molybdenum nitride metal layer.

The present application further discloses a display panel, including the following operations:

providing a first substrate;

providing a first photomask, and arranging a plurality of film materials for an active switch on the first substrate;

providing a second photomask, arranging a photoresist on the active switch, and etching each film layer material based on the photoresist to forum the active switch;

providing a third photomask to forming a protective layer on the active switch; and providing a fourth photomask, and arranging a pixel electrode layer on the protective layer;

wherein the operations of providing a second photomask, arranging a photoresist on the active switch, and etching each film layer material based on the photoresist to form the active switch comprise:

performing a first wet etching on the active switch;

performing a first dry etching and two ashing treatments on the active switch;

performing a second wet etching on the active switch;

performing a second dry etching on the active switch; and removing the photoresist, and obtaining an array substrate and a color filter substrate arranged opposite to the array substrate.

Compared with the solution of using 2W2D to result in the residual photoresist in the channel region, the present application uses the first ashing treatment to treat the photoresist before the first day etching, so that the photoresist can be thinned, and it is beneficial to improve the problem that the photoresist channel region is not flat enough. Moreover, after the first dry etching, a second ashing treatment is performed, so that the photoresist channel region is completely etched, and the problem of photoresist residue in the channel region is solved. In this way, it can be ensured that the subsequent process will not be affected by the photoresist residues, thereby improving the yield and improving the display effect.

BRIEF DESCRIPTION OF DRAWINGS

FIGS. 5a through 5l illustrate a flowchart of a manufacturing process corresponding to the flowcharts of FIGS. 4a and 4b.

DETAILED DESCRIPTION OF EMBODIMENTS

Figure 1A:
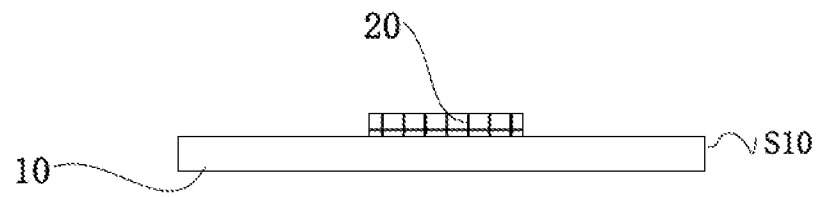
FIGS. 1a through 1j illustrate a flowchart of a manufacturing process of an array substrate according to the present application.
Figure 1B:
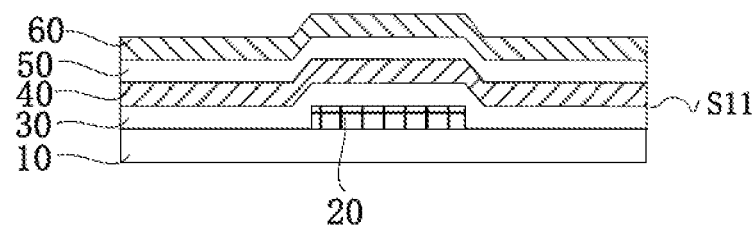
Figure 1C:
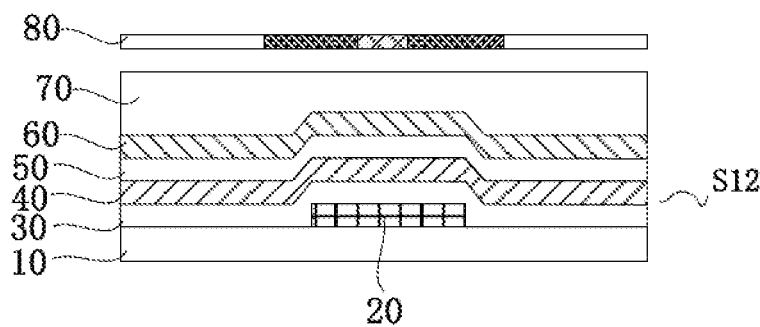
Figure 1D:
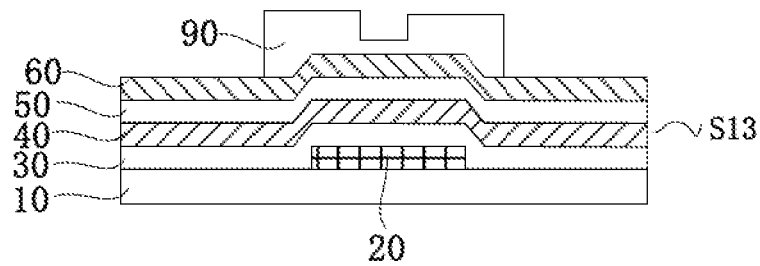
Figure 1E:
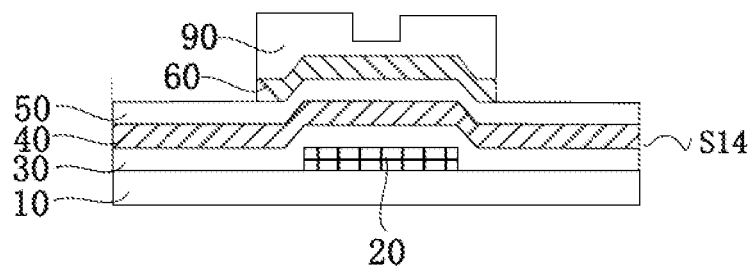
Figure 1F:
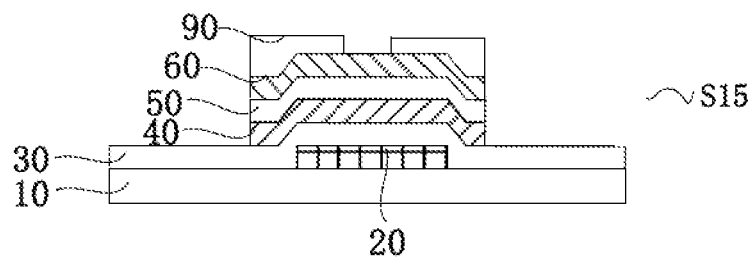
Figure 1G:
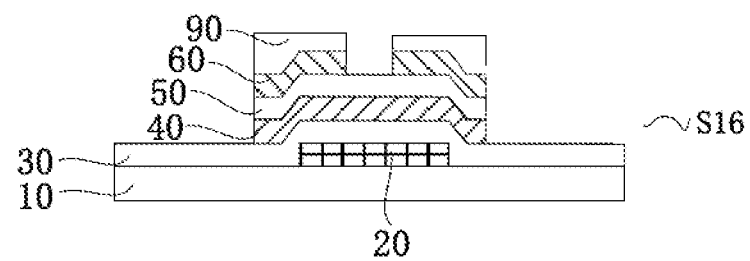
Figure 1H:
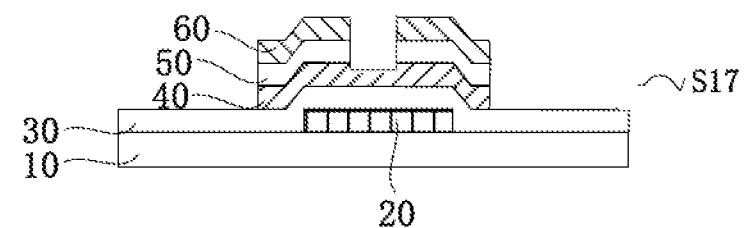
Figure 1I:
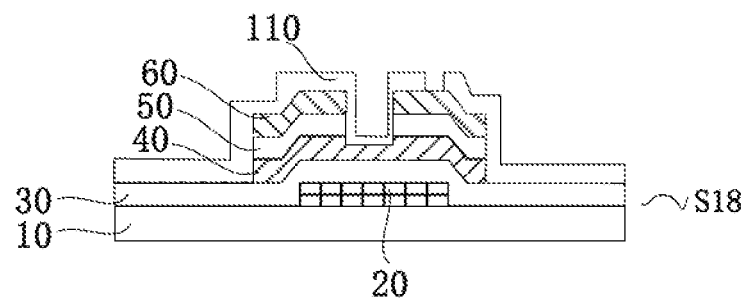
Figure 1J:
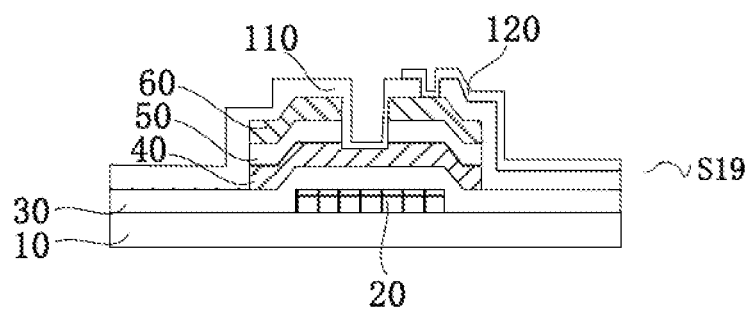
Figure 2A:
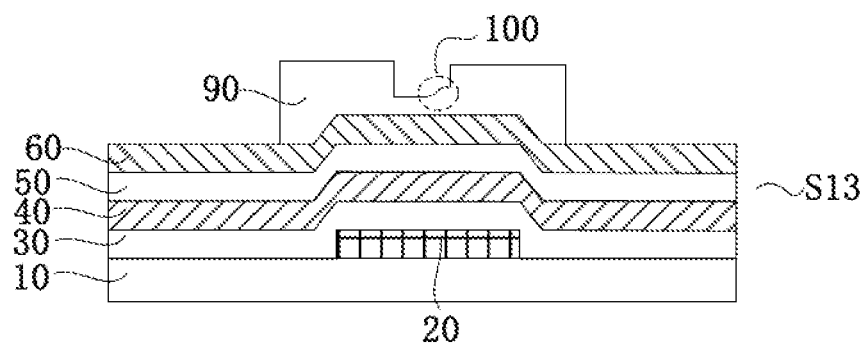
FIGS. 2a through 2f illustrate a flowchart of an improved manufacturing process of an array substrate according to the present application.
Figure 2B:
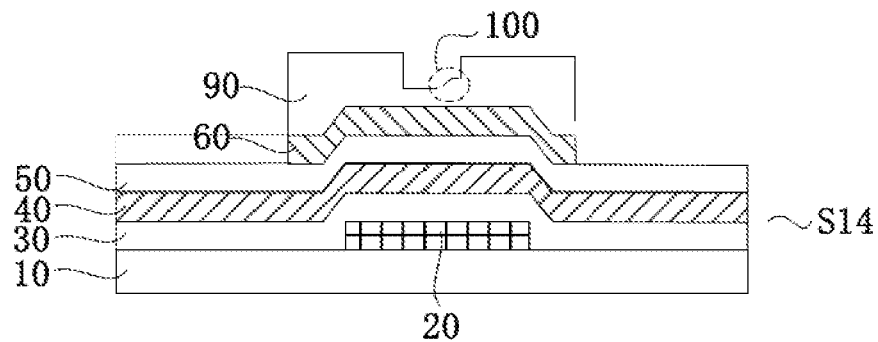
Figure 2C:
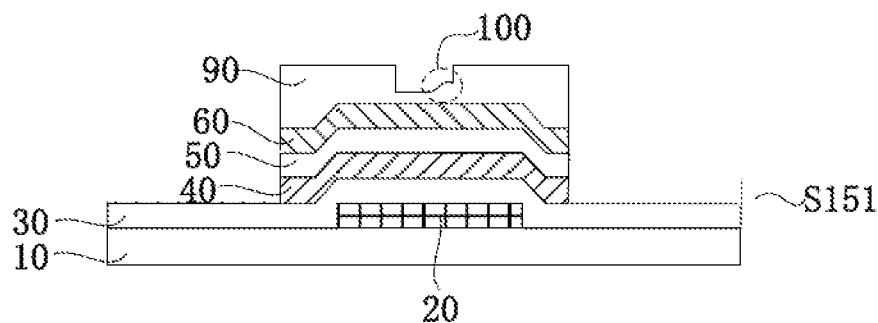
Figure 2D:
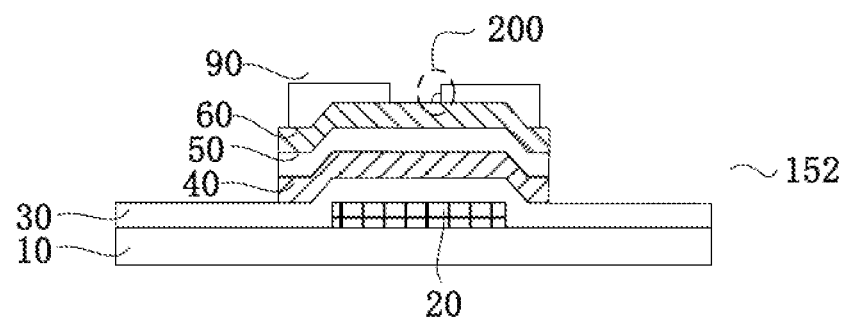
Figure 2E:
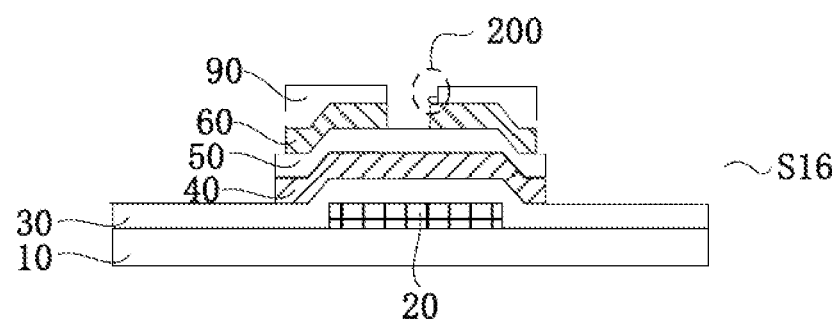
Figure 2F:
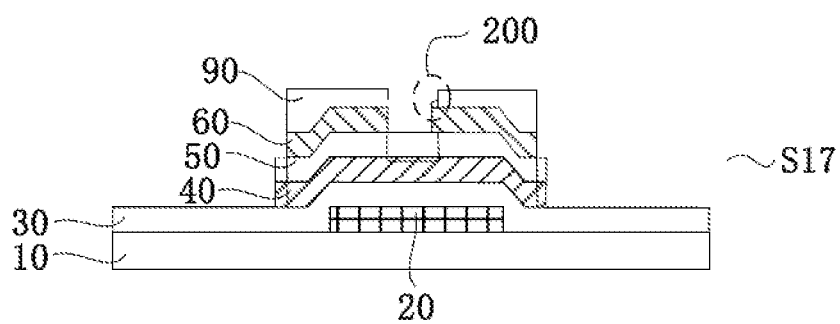

FIGS. 1a through 1j illustrate a flowchart of a manufacturing process of an array substrate of the present application, and FIGS. 2a through 2f illustrate a flowchart of an improved manufacturing process of an array substrate of the present application. As illustrated in FIGS. 1a through 1j, this undisclosed technical solution specifically includes the following operations: S10, providing a first substrate 10, providing a first photomask, and forming a gate electrode 20 on the first substrate 10; S11, sequentially forming a gate insulating material layer 30, an active material layer 40, an ohmic contact material layer 50, and a second metal material layer 60 on the gate electrode 20; S12, forming a photoresist material layer 70 on the second metal material layer 60, and providing a second photomask 80; S13, forming a photoresist 90 with a thickness corresponding to the source electrode and the drain electrode greater than the thickness corresponding to the channel region on the second metal material layer 60; S14, performing a first wet etching on the second metal material layer 60, and etching away the portions of the second metal material layer 60 that are not covered by the photoresist 90; S15, performing a first dry etching on the active material layer 40, etching away the portion of the active material layer 40 not covered by the photoresist 90, and etching away the portion of the photoresist 90 corresponding to the channel region to expose the portion of the second metal material layer 60 in the channel region; S16, performing a second wet etching on the second metal material layer 60 to form a source electrode and a drain electrode oppositely disposed across the channel region; S17, perform a second dry etching, etching the ohmic contact material layer 50 and the active material layer 40 to form the ohmic contact layer and the active layer, and etching a groove at the position corresponding to the channel region of the ohmic contact layer, and removing the photoresist 90; S18, providing a third photomask, and providing a protective layer 110 on the active switch; and S19, providing a fourth photomask, and disposing a pixel electrode layer 120 on the protective layer 110. (Operations S13 to S17 use two dry etching processes and two wet etching processes, which are collectively referred to as 2W2D etching processes.)

More specifically, in order to ensure the effect of the subsequent process, in step S15, in addition to dry etching the semiconductor layer, it is also necessary to ensure that the position of the channel region of the photoresist 90 is etched away to expose the second metal material layer 60 in the channel region. However, it is difficult to achieve excellent results only by the existing dry etching process. Therefore, after the first dry etching, the inventor added an ashing treatment to enhance the etching effect of the photoresist 90, and the effect is very significant. Even if the photoresist 90 is thicker than before, the effect of etching to expose the second metal material layer 60 at the channel region may still be achieved.

As shown in FIGS. 2a through 2f, the inventor has mainly improved step S15 in the above process: S151, performing a first dry etching on the active material layer 40, and etching away the portion of the active material layer 40 that is not covered by the photoresist 90; S152, etching away the portion of the photoresist 90 corresponding to the channel region through an ashing treatment, exposing the second metal material layer 60 in the channel region. Although in the 2W2D process, an ashing process is added after the first dry etching to improve the etching effect of the photoresist 90 channel region, but there is still the problem of photoresist residue 200 (PR residue), which affects the subsequent process, so that the channel performance of the manufactured TFT is poor and the yield is low.

The inventor's research found that:

In the manufacturing process, the yellow light process is an important operation that affects the thickness of each film layer of the final fabricated device. Yellow light is the processing of protecting the bottom layer by the photosensitive substance (also known as photoresist) coated on the surface of the glass that is left after exposure and development, and then etching and stripping from the mold to finally obtain a permanent pattern. Exposure is a process in which ultraviolet light is irradiated on the photomask, and further irradiated on the photoresist 90 through a light-transmitting area on the photomask, and the photoresist 90 is irradiated by ultraviolet light and undergoes a chemical reaction. The processing capabilities of a lithography machine mainly involve the resolution and the depth of focus. Resolution (R) is the minimum distance that the optical system can distinguish between two objects. The smaller the resolution, the better. The resolution formula:

$$R = k1\frac{\lambda}{NA};$$

The Depth of Focus (DOF)—along the optical path, the moving distance of the best focal plane of the pattern can be maintained:

$$DOF = k2\frac{\lambda}{(NA)^2};$$

where λ-wavelength, NA-numerical aperture, k1-process factor 1, k1-process factor 2. The above formulas of resolution and focal depth are exemplary techniques, which are not the inventive points of the present application, and will not be described herein in detail.

It can be seen from the above two formulas that R is proportional to DOF. From the perspective of mass production, it is always desirable to obtain a relatively large depth of focus, which will lead to an increase in resolution, and an increase in resolution will lead to a decrease in the distinguishing resolution of the exposure machine. The reduction in the distinguishing resolution results in a larger illumination circular spot. After the circular light spot becomes larger, the central energy of the circular light spot is relatively sufficient, while the peripheral energy is weak, which makes the exposure of the photoresist 90 to the light uneven, and the subsequent development and etching processes will cause the remaining photoresist 90 (PR remain) to have defects with uneven thickness 100, which is the reason for the occurrence of photoresist residue 200 (PR residue) in the subsequent process. This is a problem that cannot be solved only by increasing the asking time. Therefore, if the time is increased to ensure that the PR residues are completely etched, the photoresist. 90 above the corresponding source and drain electrodes will be etched too thin to complete the subsequent process, and the second metal material layer 60 at the channel region will also be etched and affect the characteristics of the channel region.

Based on the above-mentioned improved solution, the inventor makes further improvements to obtain the following solution.

The present application will be described in detail below with reference to the accompanying drawings and optional embodiments.

Figure 3A:
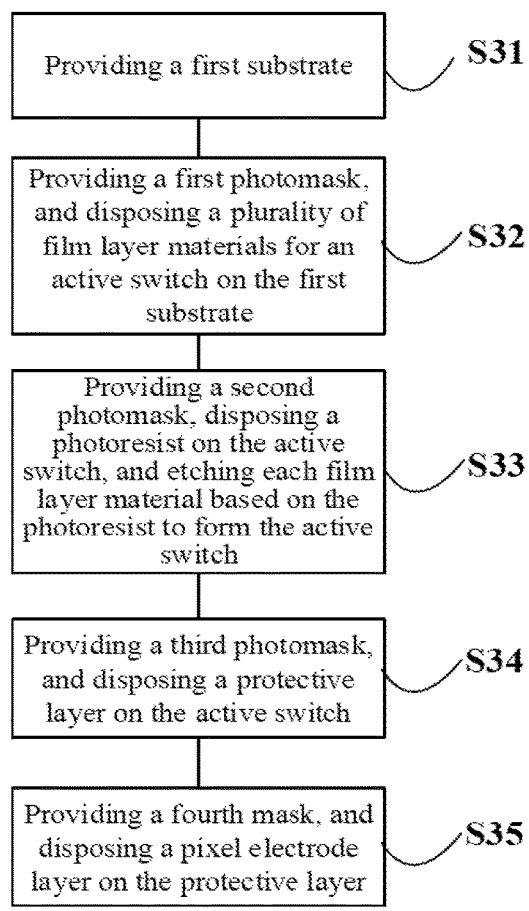
FIG. 3a is a flowchart of a method for manufacturing an array substrate according to Embodiment 1 of the present application.
Figure 3B:
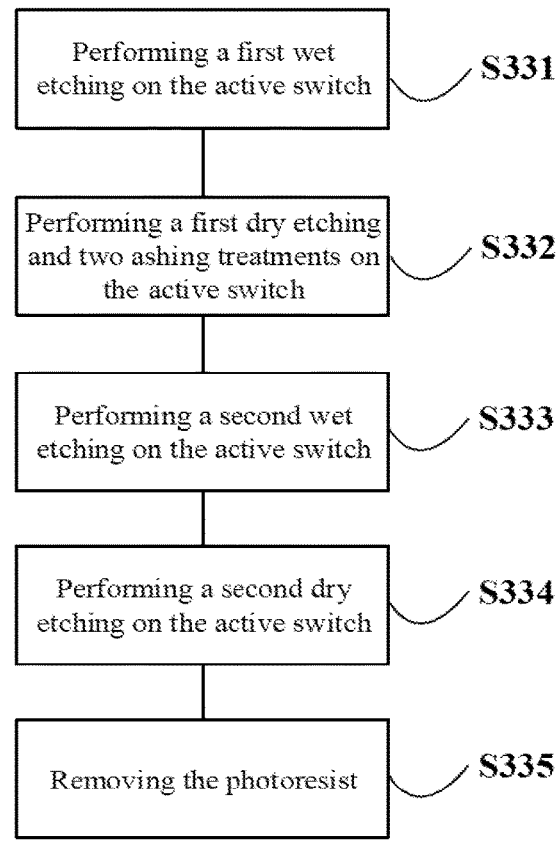
FIG. 3b is a detailed flowchart of operation S33 illustrated in FIG. 3a according to the present application.

FIG. 3a is a flowchart of a method for manufacturing an array substrate according to an embodiment of the present application, and FIG. 3b is a detailed flowchart of step S33 in FIG. 3a of the present application. As illustrated in FIGS. 3a and 3b, the present application discloses a method for manufacturing an array substrate, comprising the following operations:

S31: providing a first substrate 10;

S32: providing a first photomask, and arranging a plurality of film materials for an active switch on the first substrate 10;

S33: providing a second photomask 80, disposing a photoresist 90 on the active switch, and etching each film layer material based on the photoresist 90 to form the active switch;

S34: providing a third photomask to forming a protective layer 110 on the active switch; and S35: providing a fourth photomask, and disposing a pixel electrode layer 120 on the protective layer 110;

where the operations of S33, namely providing a second photomask 80, arranging a photoresist 90 on the active switch, and etching each film layer material based on the photoresist 90 to form the active switch comprise:

S331: performing a first wet etching on the active switch;

S332: performing a first dry etching and two ashing treatments on the active switch;

S333: performing a second wet etching on the active switch;

S334: performing a second dry etching on the active switch; and

S335: removing the photoresist 90;

Compared with the solution of using 2W2D to result in the residues of the photoresist 90 and affect the yield of subsequent processes, the present application uses the first ashing treatment to treat the photoresist 90 before the first dry etching, so that the photoresist 90 can be thinned.

Moreover, after the first dry etching, a second ashing treatment is performed, so that the photoresist 90 is completely etched, and the problem of photoresist 90 residue is solved and only the required photoresist 90 portions are retained. In this way, it can be ensured that the subsequent process will not be affected by the photoresist 90 residues, thereby improving the yield and improving the display effect. The composition of the etching solution of the first wet etching and the second wet etching is mainly a mixed liquid of: phosphoric acid or orthophosphoric acid (chemical formula H3PO4); acetic acid (chemical formula CH3COOH); and nitric acid (chemical formula HNO3). The etching gas for the first dry etching is a mixed gas of chlorine (chemical formula CL2) and sulfur hexafluoride (chemical formula SF6). The etching gas for the second dry etching is a mixture of sulfur hexafluoride (chemical formula SF6), oxygen (chemical formula O2) and helium (chemical formula He).

Figure 4A:
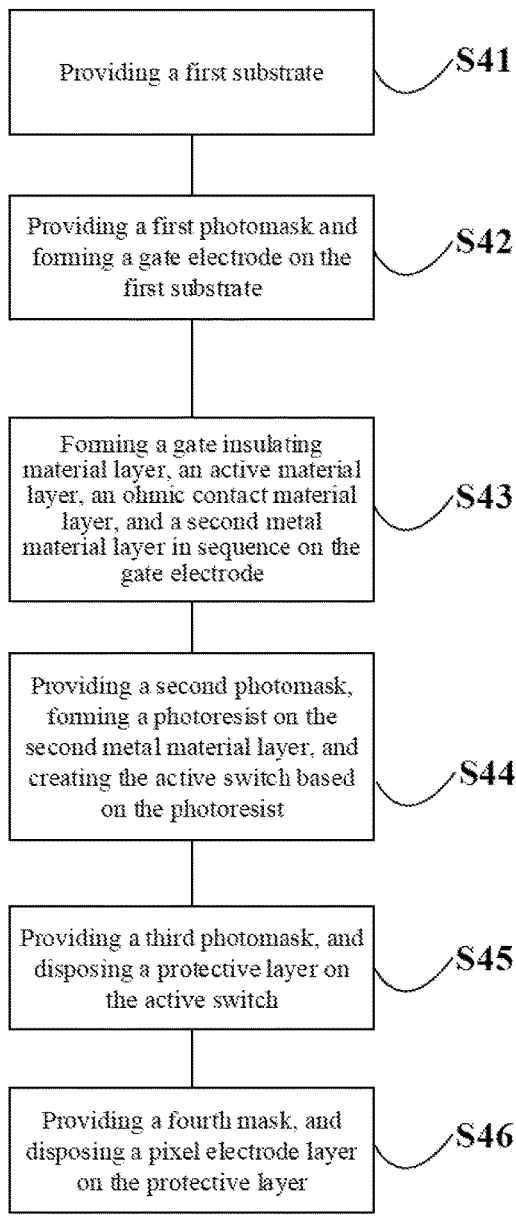
FIG. 4a is a flowchart of a method for manufacturing an array substrate according to Embodiment 2 of the present application.
Figure 4B:
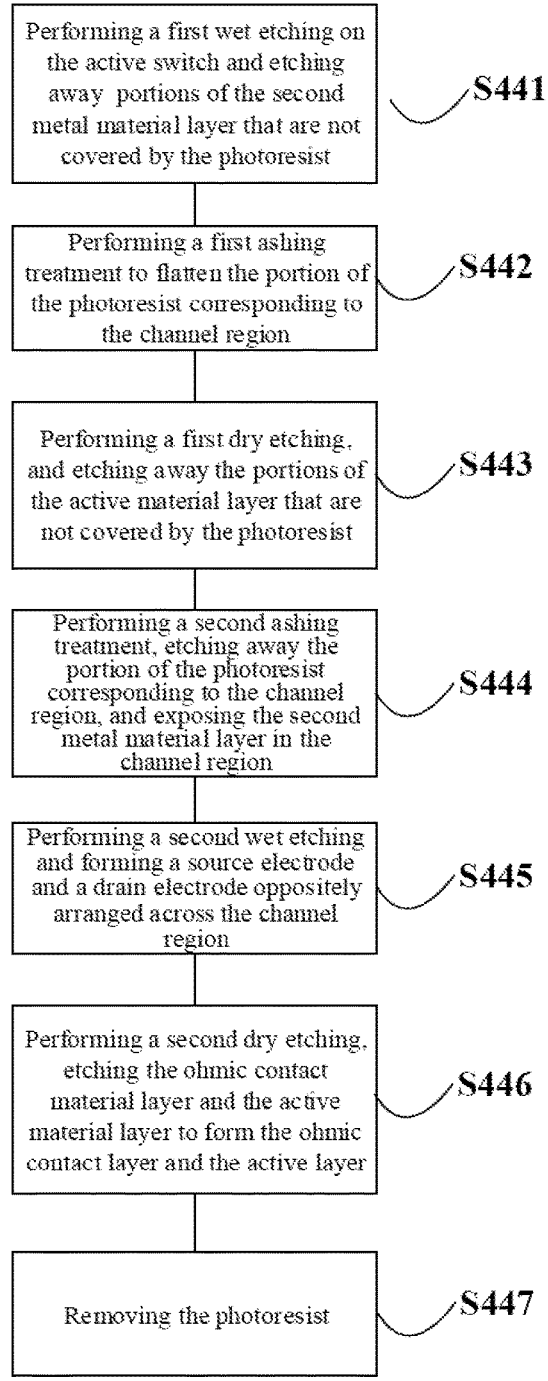
FIG. 4b is a detailed flow chart of operation S44 illustrated in FIG. 4a according to the present application.
Figure 5A:
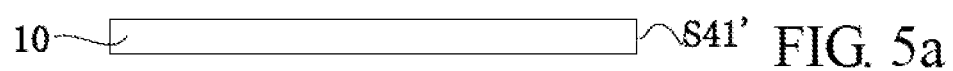
Figure 5B:
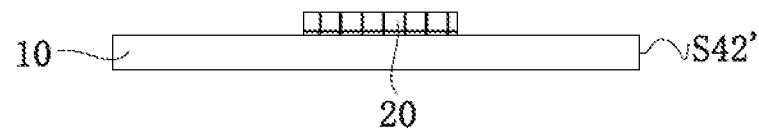
Figure 5C:
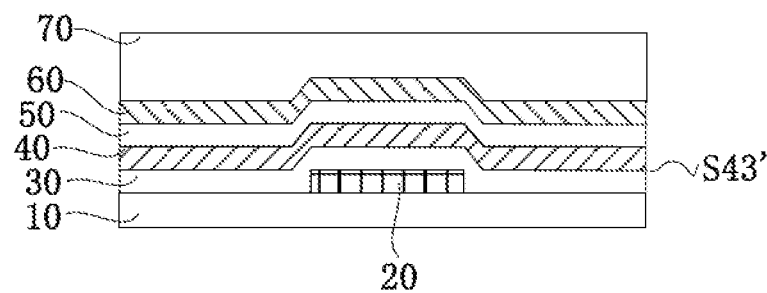
Figure 5D:
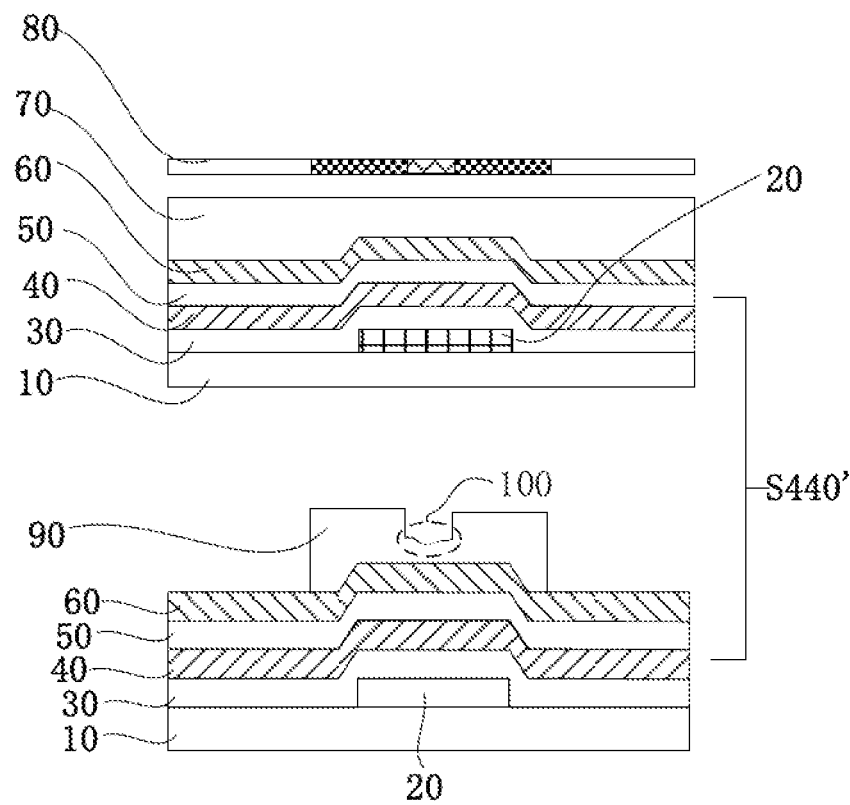
Figure 5E:
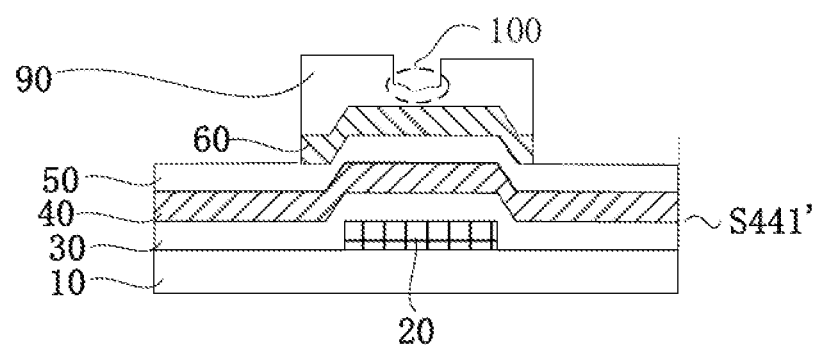
Figure 5F:
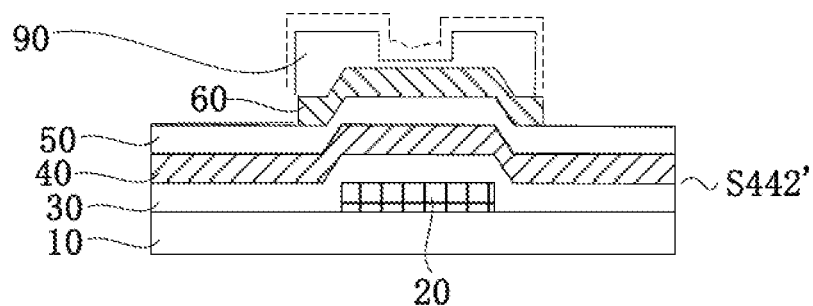
Figure 5G:
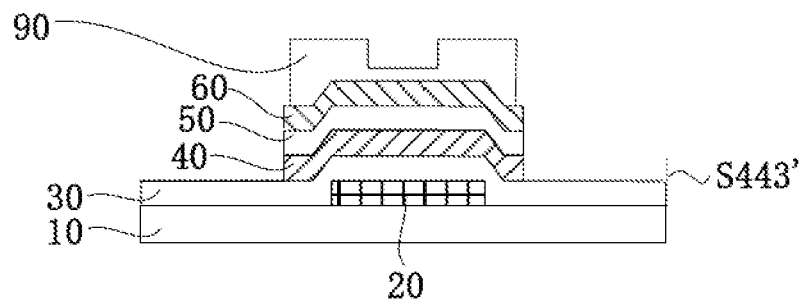
Figure 5I:
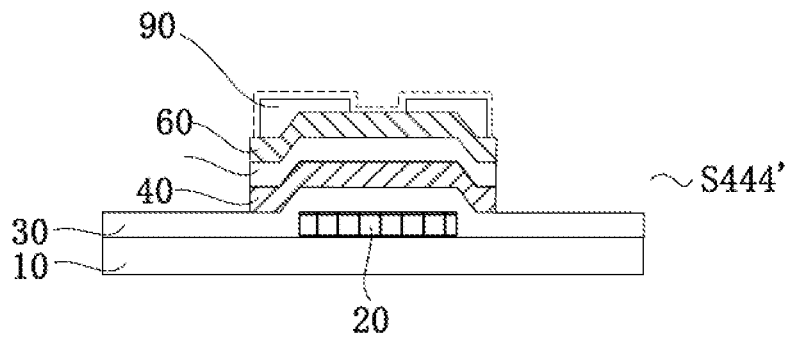
Figure 5J:
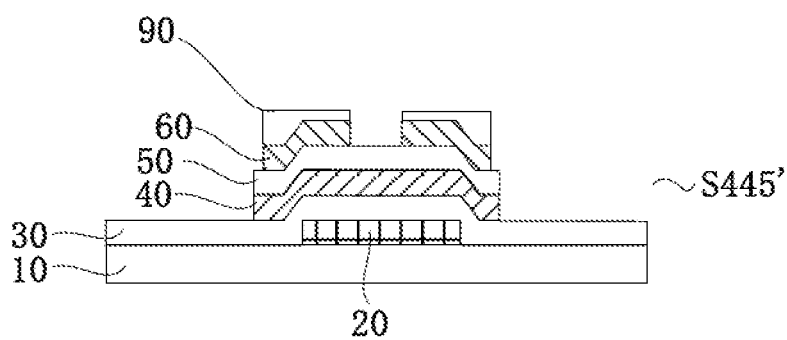
Figure 5K:
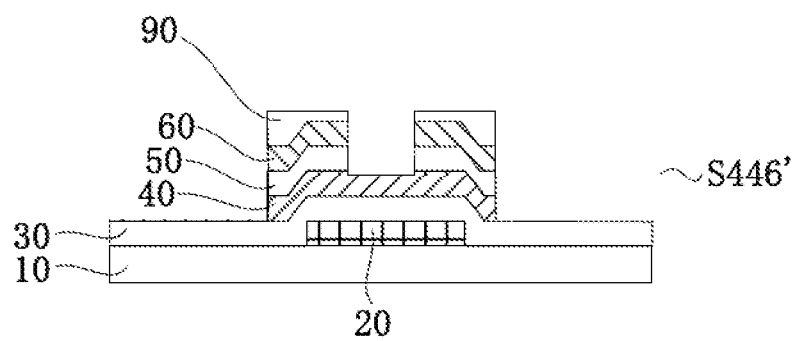
Figure 5L:
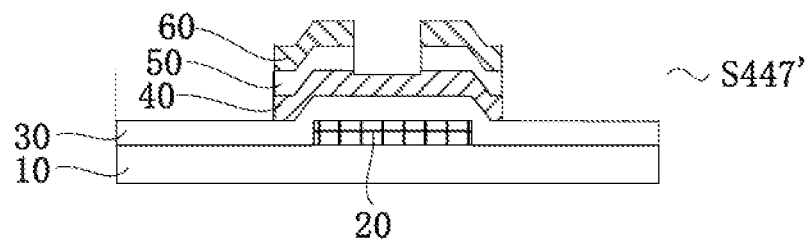

The manufacturing method of the present application can be applied to the active switch of the top gate structure, and can also be applied to the active switch of the bottom gate structure, as long as it is applicable. The following takes the bottom gate structure as an example to further illustrate the manufacturing method:

FIG. 4*a* is a flowchart of a method for manufacturing an array substrate according to Embodiment 2 of the present application, FIG. 4*b* is a detailed flowchart of operation S44 illustrated in FIG. 4*a* of the present application, and FIGS. 5*a* through 5*l* illustrate a flowchart of a manufacturing process corresponding to the flowcharts of FIGS. 4*a* and 4*b*. As illustrated in FIGS. 4*a* and 4*b*, more specifically, this embodiment further improves each step of the embodiment illustrated in FIGS. 3*a* and 3*b*, where the steps S42 and S43 are improvements to step S32, step S44 is an improvement of S33, step S441 is an improvement of step S331, steps S442-S444 is an improvement of step S332, step S445 is an improvement of step S33, and step S446 is an improvement of step S334. Specifically, the manufacturing method of the array substrate includes the following steps:

S41: providing a first substrate 10;

S42: providing a first photomask, and forming a gate electrode 20 on the first substrate 10;

S43: sequentially forming a gate insulating material layer 30, an active material layer 40, an ohmic contact material layer 50, a second metal material layer 60, and a photoresist material layer 70 on the gate electrode 20;

S44: providing a second photomask 80, forming a photoresist 90 on the second metal material layer 60 with a thickness corresponding to the source electrode and the drain electrode greater than the thickness corresponding to the channel region, and etching the active material layer 40 and the ohmic contact material, and the second metal material layer 60 based on the photoresist 90 to form an active switch;

S45: providing a third photomask, providing a protective layer 110 on the active switch; and S46: providing a fourth photomask, and disposing a pixel electrode layer 120 on the protective layer 110;

wherein the step S44 of providing a second photomask 80, forming a photoresist 90 on the second metal material layer 60 with a thickness corresponding to the source electrode and the drain electrode greater than the thickness corresponding to the channel region, and etching the active material layer 40 and the ohmic contact material, and the second metal material layer 60 based on the photoresist 90 to form an active switch comprises:

S441: performing a first wet etching on the second metal material layer 60 and etching away the portions of the second metal material layer 60 that are not covered by the photoresist 90;

S442: performing a first ashing treatment on the photoresist 90 to flatten the photoresist 90 in the channel region;

S443: performing a first dry etching on the active material layer 40, and etching away the portions of the active material layer 40 that are not covered by the photoresist 90;

S444: performing a second ashing process on the photoresist 90, etching away the portion of the photoresist 90 corresponding to the channel region, and exposing the second metal material layer 60 in the channel region;

S445: performing a second wet etching on the second metal material layer 60 to form a source electrode and a drain electrode oppositely arranged across the channel region;

S446: performing a second dry etching, etching the ohmic contact material layer 50 and the active material layer 40 to form the ohmic contact layer and the active layer; and S447: removing the photoresist 90.

As illustrated in FIGS. 5*a* through 5*j*, steps S41', S42', S43', S44', S45' and S46' in the figure respectively show the change process of each film layer of the active switch in steps S41 to S46 in FIG. 4*a*. Steps S440', S441', S442', S443', S444', S445' and S446' to S447' in the figure respectively show the change process of each film layer of the active switch in steps S441' to S447 in FIG. 4*b*. The various film layers refer to the gate electrode 20, the gate insulating material layer 30, the active material layer 40, the ohmic contact material layer 50, the second metal material layer 60, and the photoresist material layer 70 above the first substrate 10. The photoresist material layer 70 is exposed and developed through a halftone mask 80 before the first dry etching process to form a photoresist pattern 90 with a thickness corresponding to the source and drain positions greater than that corresponding to the channel region. The two ashing treatments in this embodiment solve the problem of uneven thickness defect 100 present in the remaining photoresist 90 (PR remain) after exposure and development through the halftone mask 80, thereby improving the subsequent photoresist residues problem, improving the performance of the channel region and improving the yield of the product.

Compared with the solution of using 2W2D to result in the residual photoresist in the channel region, the present application uses the first ashing treatment to treat the photoresist 90 before the first dry etching, so that the photoresist 90 can be thinned to improve the uniformity of the remaining photoresist 90 (PR remain), especially the problem that the channel region of the remaining, photoresist 90 is not flat enough. Moreover, after the first dry etching, a second ashing treatment is performed, where the good uniformity of the photoresist 90 enables complete etching of the photoresist 90 in the channel region, and the problem of photoresist 90 residue (PR residue) in the channel region is solved. In this way, it can be ensured that the subsequent process will not be affected by the photoresist residues in the channel region, thereby improving the yield and improving the display effect. Moreover, even if the material or process of the photoresist 90 cannot reach the degree of sufficiently thin and uniform, the required photoresist 90 thickness and photoresist 90 uniformity can be achieved by adjusting two ashing treatments, so that the photoresist 90 can be set to different photoresist thickness and photoresist uniformity requirements for the display panel manufacturing process.

Figure 6A:
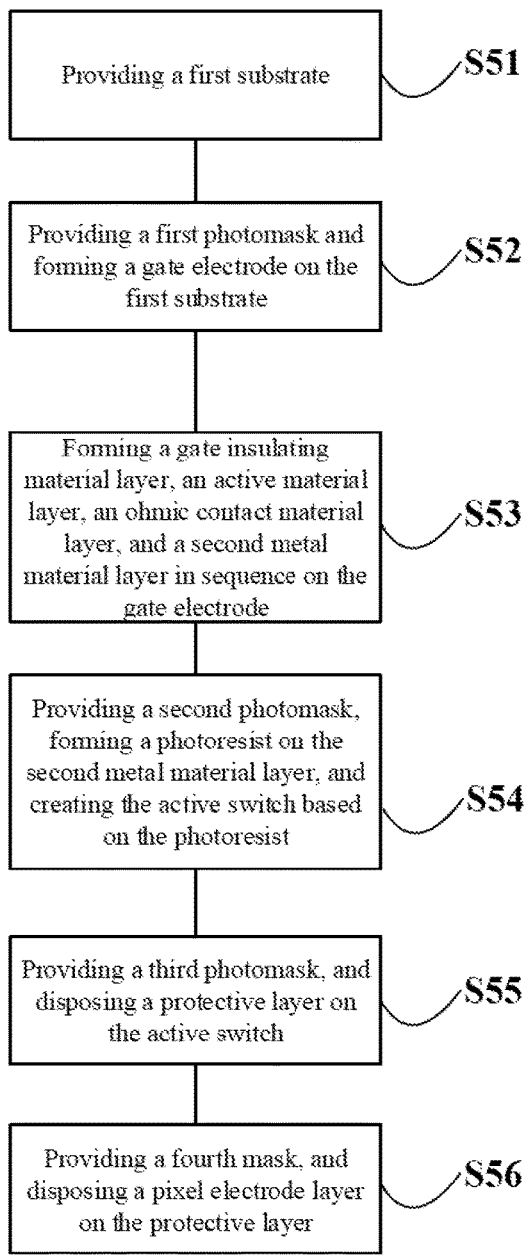
FIG. 6a is a flowchart of a method for manufacturing an array substrate according to Embodiment 3 of the present application.
Figure 6B:
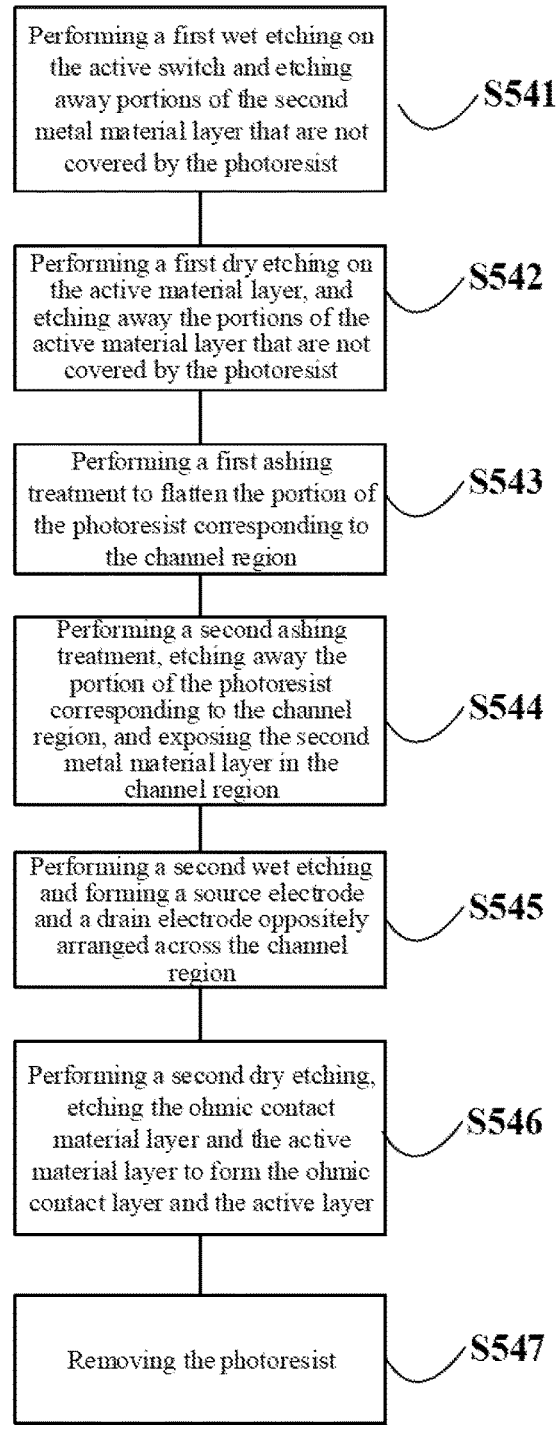
FIG. 6b is a detailed flowchart of operation S54 illustrated in FIG. 6a according to the present application.

FIG. 6a is a flowchart of a method for manufacturing an array substrate according to Embodiment 3 of the present application, and FIG. 6b is a detailed flowchart of step S54 in FIG. 6a of the present application. As illustrated in FIG. 6a and FIG. 6b, the following manufacturing method of the array substrate can also be used. This embodiment also further improves each step of the embodiment illustrated in FIGS. 3a and 3b, where the steps S52 and S53 are improvements to step S32, step S54 is an improvement of S33, step S541 is an improvement of step S331, steps S542-S544 is an improvement of step S332, step S545 is an improvement of step S33, and step S546 is an improvement of step S334. Specifically, the manufacturing method of the array substrate includes the following steps:

Including the following steps:

S51: providing a first substrate 10;

S52: providing a first photomask, and forming a gate electrode 20 on the first substrate 10;

S53: sequentially forming a gate insulating material layer 30, an active material layer 40, an ohmic contact material layer 50, a second metal material layer 60, and a photoresist material layer 70 on the gate electrode 20;

S54: providing a second photomask 80, forming a photoresist 90 on the second metal material layer 60 with a thickness corresponding to the source electrode and the drain electrode greater than the thickness corresponding to the channel region, and etching the active material layer 40 and the ohmic contact material, and the second metal material layer 60 based on the photoresist 90 to form an active switch;

S55: providing a third photomask, providing a protective layer 110 on the active switch; and S56: providing a fourth photomask, and disposing a pixel electrode layer 120 on the protective layer 110;

wherein the step S54 of providing a second photomask 80, forming a photoresist 90 on the second metal material layer 60 with a thickness corresponding to the source electrode and the drain electrode greater than the thickness corresponding to the channel region, and etching the active material layer 40 and the ohmic contact material, and the second metal material layer 60 based on the photoresist 90 to form an active switch comprises:

S541: performing a first wet etching, on the second metal material layer 60, and etching away the portions of the second metal material layer 60 that are not covered by the photoresist 90;

S542: performing a first thy etching on the active material layer 40, and etching away the portions of the active material layer 40 that are not covered by the photoresist 90;

S543: performing a first ashing treatment on the photoresist 90 to flatten the photoresist 90 in the channel region;

S544: performing a second ashing process on the photoresist 90, etching away the portion of the photoresist 90 corresponding to the channel region, and exposing the second metal material layer 60 in the channel region;

S545: performing a second wet etching on the second metal material layer 60 to form a source electrode and a drain electrode oppositely arranged across the channel region;

S546: performing a second dry etching, etching the ohmic contact material layer 50 and the active material layer 40 to form the ohmic contact layer and the active layer; and S547: removing the photoresist 90.

Similarly, compared with the solution of using 2W2D to result in the residual photoresist 90 in the channel region, the present application first uses the first ashing treatment to treat the photoresist 90 after the first dry etching, so that the photoresist 90 can be thinned to improve the uniformity of the remaining photoresist 90 (PR remain), especially the problem that the channel region of the remaining photoresist 90 is not flat enough. As such, when a second ashing treatment is performed, the good uniformity of the photoresist 90 enables complete etching of the photoresist 90 in the channel region, and the problem of photoresist residue (PR residue) in the channel region is solved. In this way, it can be ensured that the subsequent process will not be affected by the photoresist residues in the channel region, thereby improving the yield and improving the display effect.

The first ashing treatment and the second ashing treatment can be performed at a power of 5000 W-15000 W and a temperature of 25° C.-60° C., which can be adjusted according to the actual panel and photoresist conditions. Since it is not the main inventive point of the present application, it will not be detailed herein. Optionally, in this embodiment, the ashing gas used in the first ashing treatment and the second ashing treatment is oxygen. Oxygen is used for both ashing treatments, resulting in a good ashing effect, and the problem of photoresist residue is avoided. Different flow rates may be used for the two ashing treatments, for example, the flow rate of the first ashing treatment may be smaller than the flow rate of the second ashing treatment.

Optionally in this embodiment, the flow rate of the first ashing treatment is 7000 Scc/min-9000 Scc/min and the duration is 15 s-25 s; the flow rate of the second ashing treatment is 7000 Scc/min-9000 Scc/min, the duration is 35 s-45 s.

In this embodiment, oxygen is selected as the ashing gas, the ashing speed is moderate, the ashing effect is sufficient, and with a reasonable flow rate and ashing time, the thinning effect of the first ashing treatment can be well controlled to ensure the uniformity of the remaining photoresist 90, especially the remaining photoresist 90 at the channel region. In addition, the thinning effect of the second ashing treatment can be well controlled to ensure that the channel region of the photoresist 90 is completely etched.

The flow rate and duration of the first ashing process can be adjusted depending on the actual thickness of the photoresist 90. If the photoresist 90 is too thick, the flow rate and duration can be increased. If the photoresist 90 is relatively thin, the flow rate and duration can be reduced. However, in the first ashing treatment, the flow rate and duration cannot expose the second metal material layer 60 in the channel region, and more importantly cannot affect the subsequent processes. The second ashing treatment cannot apply excessive asking to damage the function of the second metal material layer 60 while ensuring that the photoresist residue problem is resolved.

More specifically, the flow rate of the first ashing treatment is 8000 Scc/min, and the duration is 20 s; the flow rate of the second ashing treatment is 8000 Scc/min, and the duration is 40 s.

Optionally in this embodiment, the ashing gas used in the first ashing treatment is oxygen, and the ashing gas used in the second ashing treatment is a mixed gas of oxygen and sulfur hexafluoride. In the step of the first ashing treatment, the flow rate of feeding oxygen is 77000 Scc/min-9000 Scc/min. In the step of the second ashing treatment, the flow rate of feeding oxygen is 6000 Scc/min-12000 Scc/min, and the flow rate of feeding sulfur hexafluoride is 100 Scc/min-500 Scc/min.

The duration of the first asking treatment is 15-25 s, and the duration of the second ashing treatment is 10-20 s. In this embodiment, in the first ashing treatment, only oxygen is used for the asking treatment, and the ashing rate is slow and comprehensive. In this way, the photoresist uniformity at the channel region position of the remaining photoresist 90 can be better improved, which has a good influence on the subsequent processes. Furthermore, in the second ashing treatment, a mixed gas of oxygen and sulfur hexafluoride is used as the ashing gas to speed up the ashing speed and ensure that the problem of photoresist residue is solved.

Optionally in this embodiment, the step of providing a second photomask 80, and forming a photoresist 90 with a thickness corresponding to the source electrode and the drain electrode position on the second metal material layer 60 greater than the thickness corresponding to the channel region position includes: providing a second photomask 80, and forming a U-shaped photoresist 90 with a thickness of 1.4 um-1.6 um corresponding to the source electrode and drain electrode positions and a thickness of 0.4 um-0.6 um corresponding to the channel region on the second metal material layer 60;

The step of performing the first ashing treatment on the photoresist 90 includes: performing the first asking treatment on the photoresist 90 to thin the photoresist 90 as a whole by 0.15 um-0.25 um;

The step of performing a second ashing treatment on the photoresist 90 includes: performing a second ashing treatment on the photoresist 90 to thin the photoresist 90 as a whole by 0.25 um-0.35 um, so as to completely etch away the portion of the photoresist 90 corresponding to the channel region to expose the channel.

The reduced thickness of the first ashing process can be adjusted depending on the actual thickness of the photoresist 90. If the photoresist 90 is too thick, the degree of thinning can be increased. If the photoresist 90 is relatively thin, the degree of thinning can be reduced. However, in the first ashing treatment, the maximum thinning degree cannot expose the second metal material layer 60 in the channel region, and more importantly, cannot affect the subsequent processes. The second ashing treatment cannot apply excessive aching to damage the function of the second metal material layer 60 while ensuring that the photoresist residue problem is resolved. For example, the duration of the second ashing treatment can be appropriately increased to thin the portion of the photoresist 90 corresponding to the source and drain positions by more than 0.35 um and less than 0.45 um to further ensure that the portion of the photoresist 90 in the channel region is completely etched, but the second metal material layer 60 will not be damaged by excessive etching.

Optionally in this embodiment, the ashing gas of each of the first ashing treatment and the second ashing treatment is a mixed gas of oxygen and sulfur hexafluoride and the flow rate ratio of oxygen and sulfur hexafluoride is 8000:100. That is, oxygen is doped with sulfur hexafluoride, which can speed up the ashing speed. The flow rate ratio of this embodiment can speed up the ashing speed without the problem of excessive ashing.

Certainly, in the two ashing treatments, the flow rate ratios of oxygen and sulfur hexafluoride can also be different.

For example, the ashing gas of each of the first ashing treatment and the second ashing treatment is a mixed gas of oxygen and sulfur hexafluoride. In the step of the first ashing treatment, the flow rate of introducing oxygen is 6000 Scc/min-12000 Scc/min, and the flow rate of introducing sulfur hexafluoride is 0 Scc/min-50 Scc/min. In the step of the second ashing treatment, the flow rate of feeding oxygen is 6000 Scc/min-12000 Scc/min, and the flow rate of feeding sulfur hexafluoride is 100 Scc/min-500 Scc/min.

The duration of the first ashing treatment is 5-10 s, and the duration of the second ashing treatment is 10-20 s. During the first ashing treatment, in the mixed gas of oxygen and sulfur hexafluoride, the flow rate of sulfur hexafluoride is relatively small. While improving the ashing rate, it ensures that the channel region of the remaining photoresist 90 can achieve good photoresist uniformity. In the second ashing treatment, the flow rate of sulfur hexafluoride is relatively large, which increases the ashing rate and thus improves the production efficiency.

In particular, the duration of the first ashing treatment is 5-10 s and the duration of the second ashing treatment is 10-20 s. In this embodiment, in the ashing process in which the main part is oxygen, doping with fluorine Hexoxide can increase the ashing speed and improve the production efficiency.

Optionally in this embodiment, the second metal material layer 60 has a three-layer structure, where the lowermost layer is a molybdenum metal layer, the middle layer is an aluminum metal layer, and the uppermost layer is a molybdenum nitride metal layer. The two ashing treatments can both improve the unevenness of the remaining photoresist 90, especially the unevenness of the photoresist 90 in the channel region and the problem of the residual photoresist 90 in the channel region. However, during the second ashing treatment, there is a possibility of excessive ashing. In this embodiment, the uppermost layer of the second metal material layer 60 is replaced with molybdenum nitride, which has strong anti-ashing and anti-etching capabilities, thus reducing the etching speed to protect the second metal material layer 60, so as to prevent the thickness of the second metal material layer 60 from changing to affect the functions of the formed source and drain electrodes.

Optionally in this embodiment, in the first ashing treatment, oxygen can be selected as the ashing gas for relatively slow ashing, and in the second ashing treatment, a mixed gas of oxygen and sulfur hexafluoride can be selected as the ashing gas, thus improving the production efficiency.

Figures 7A, 7B:
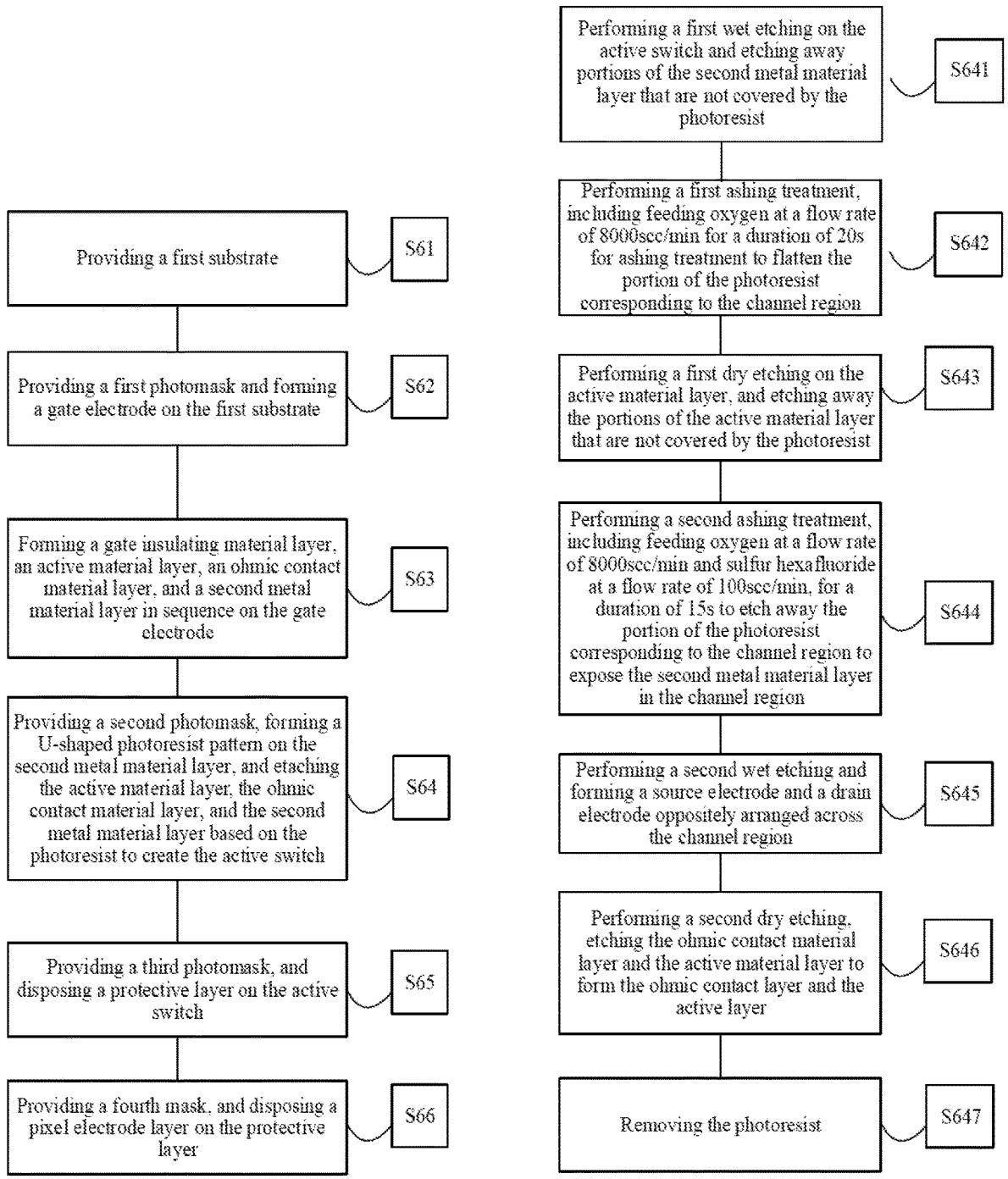
FIG. 7a is a flowchart of a method for manufacturing an array substrate according to Embodiment 4 of the present application.
FIG. 7b is a detailed flow chart of operation S64 illustrated in FIG. 7a according to the present application.

FIG. 7a is a flowchart of a method for manufacturing an array substrate according to Embodiment 4 of the present application, and FIG. 7b is a detailed flowchart of step S64 in FIG. 7a of the present application. As illustrated in FIG. 7a and FIG. 7b, the present application further discloses a method for manufacturing an array substrate, comprising the following operations:

S61: providing a first substrate 10;

S62: providing a first photomask, and forming a gate electrode 20 on the first substrate 10;

S63: sequentially forming a gate insulating material layer 30, an active material layer 40, an ohmic contact material layer 50, a second metal material layer 60, and a photoresist material layer 70 on the gate electrode 20;

S64: providing a second photomask 80 and forming a U-shaped photoresist pattern 90 with a thickness of 1.4 um-1.6 um corresponding to the source and drain positions and a thickness of 0.4 um-0.6 um corresponding to the channel region on the second metal material layer 60, and further forming an active switch by etching the active material layer 40, the ohmic contact material layer 50 and the second metal material layer 60 based on the photoresist pattern 90;

S65: providing a third photomask, providing a protective layer 110 on the active switch; and S66: providing a fourth photomask, and disposing a pixel electrode layer 120 on the protective layer 110;

wherein the operations of providing a second photomask 80 and forming a U-shaped photoresist pattern 90 with a thickness of 1.4 um-1.6 um corresponding to the source and drain positions and a thickness of 0.4 um-0.6 um corresponding to the channel region on the second metal material layer 60, and further forming an active switch by etching the active material layer 40, the ohmic contact material layer 50 and the second metal material layer 60 based on the photoresist pattern 90 comprise:

S641: performing a first wet etching on the second metal material layer 60, and etching away the portions of the second metal material layer 60 that are not covered by the photoresist 90;

S642: performing a first ashing treatment on the photoresist 90, wherein oxygen is used as the ashing gas, oxygen is introduced at a flow rate of 8000 Scc/min, and the ashing treatment is performed for 20 s to thin the photoresist 90 by 0.15 um-0.25 um to flatten the photoresist channel;

S643: performing a first dry etching on the active material layer 40, and etching away the portions of the active material layer 40 that are not covered by the photoresist 90;

S644: performing a second ashing treatment on the photoresist 90, wherein a mixed gas of oxygen and sulfur hexafluoride is used as the ashing gas, where oxygen is introduced at a flow rate of 8000 Scc/min, sulfur hexafluoride is introduced at a flow rate of 100 Scc/min, and the ashing treatment is performed for 15 s to reduce the overall thickness of the photoresist 90 by 0.25 um-0.35 um, so that the portion of the photoresist 90 corresponding to the channel region is etched away to expose the second metal material layer 60 in the channel region;

S645: performing a second wet etching on the second metal material layer 60 to form a source electrode and a drain electrode oppositely arranged across the channel region;

S646: performing a second dry etching on the active material layer 40 and the ohmic contact material layer 50, etching away the portion of the ohmic contact material layer 50 corresponding to the channel region of to form an ohmic contact layer, and simultaneously etching the portion of the active material layer 40 corresponding to the channel position to form a groove thus creating an active layer; and S647: removing the photoresist 90;

wherein the second metal material layer 60 has a three-layer structure, where the bottom layer is a molybdenum metal layer, the middle layer is an aluminum metal layer, and the top layer is a molybdenum nitride metal layer.

Specifically, for example, in the step of providing a second photomask 80 and forming a U-shaped photoresist pattern 90 on the second metal material layer 60, a photoresist material with a thickness of about 2.2 um can be laid first, and then a gray tone mask can be used to form a U-shaped photoresist pattern 90. When the thickness of the U-shaped photoresist pattern 90 corresponding to the source and drain electrodes is about 1.5 um, and the thickness corresponding to the channel region is about 0.5 um, optionally, the time of the first ashing treatment is 20 s to reduce the thickness by about 0.2 um, so that the channel region of the remaining photoresist 90 can be well smoothed and the uniformity of the remaining photoresist 90 can be improved. The duration of the second ashing process is 15 s, so as to completely etch the remaining 0.3 um of the photoresist 90's channel region.

In addition, in the two ashing treatments, in addition to thinning the thickness of the photoresist 90, the size of the photoresist 90 is also reduced. In the first ashing treatment, the edge of the photoresist 90 shrinks by about 0.1-0.2 um. In the second ashing treatment, the edge of the photoresist 90 shrinks by about 0.2-0.4 um. After two ashing treatments, the photoresist 90's channel region is completely etched, and the thickness of the photoresist 90 corresponding to the source and drain positions is about 0.6 um. The active layer is an amorphous silicon layer (a-Si), and the ohmic contact layer is an N-type high-concentration doped layer (N+).

Finally, in the present application, the first ashing treatment and the second ashing treatment may be performed in an ashing device to perform ashing treatment on the array substrate. The ashing device has a operating power of 5000 W-15000 W, a operating temperature of 25-60 degrees Celsius, and the operating air pressure is 10-40 Pa.

In the first ashing treatment, the operating power is 5000 W, the operating temperature is 25 degrees Celsius, and the operating pressure is 10 Pa. In the mildest possible environment, the ashing is relatively slow to achieve better flatness, which is beneficial to improve the yield. When necessary, the asking duration can exceed 20 s, such as 25 s.

Figure 8:
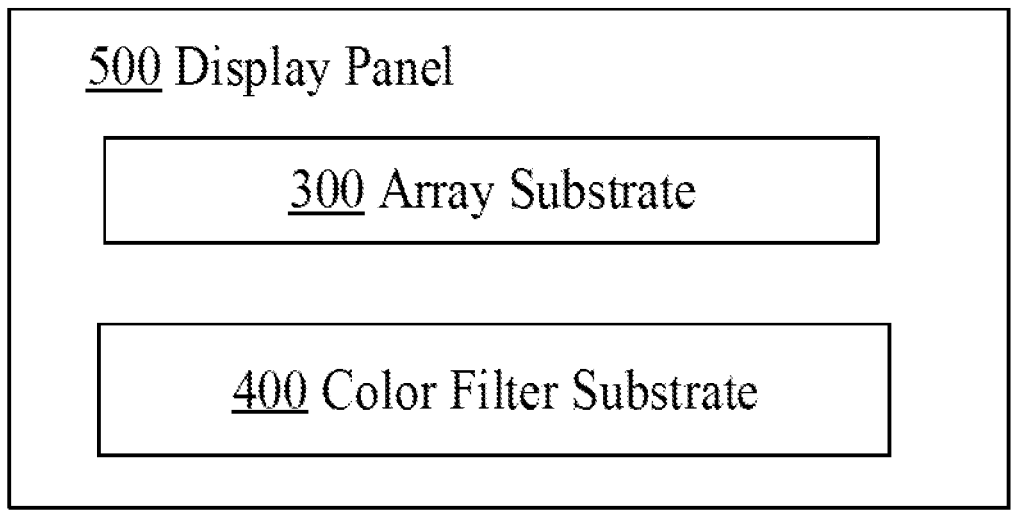
FIG. 8 is a schematic diagram of a display panel according to the present application.

FIG. 8 is a schematic diagram of a display panel according to the present application. As illustrated in FIG. 8, the present application further discloses a display panel 500, which includes an array substrate 300 manufactured by the above method for manufacturing an array substrate disclosed in the present application, and a color filter substrate 400 disposed opposite to the array substrate.

It should be noted that the description of various steps involved in this solution are not to be construed as limiting the order of steps, if the implementation of the specific solution is not affected. That is, the steps written in earlier can be performed before, or after, or even at the same time as those written later. As long as this solution can be implemented, any order of the steps should be regarded as falling the scope of protection of this application. Furthermore, in the technical solutions of the various embodiments of the present application, except the technical features that conflict with each other, other technical features may be applied in combination.

The technical solutions of the present application may be widely used as a method for manufacturing array substrates of various display panels, such as TN Twisted Nematic) display panels, IPS (In-Plane Switching) display panels, VA (Vertical Alignment) display panels, and MVA (Multi-Domain Vertical Alignment) display panels. Of course, the above solutions are also applicable to other types of display panels.

The foregoing is a further detailed description of the present application in conjunction with specific optional embodiments, but it should not be construed as that the specific implementation of the present application will be limited to these descriptions. For those having ordinary skill in the technical field of the present application, without departing, from the scope and spirit of the present application, some simple deductions or substitutions can be made, which should all be regarded as falling in the scope of protection of the present application.

What is claimed is:

1. A method of manufacturing an array substrate, comprising:
   providing a first substrate;
   providing a first photomask, and disposing a plurality of film layer materials for an active switch on the first substrate;
   providing a second photomask, disposing a photoresist on the active switch, and etching each of the plurality of film layer materials based on the photoresist to form the active switch;
   providing a third photomask, and disposing a protective layer on the active switch; and
   providing a fourth photomask, and disposing a pixel electrode layer on the protective layer;
   wherein the operation of providing a second photomask, disposing a photoresist on the active switch, and etching each of the plurality of film layer materials based on the photoresist to form the active switch comprises:
   performing a first wet etching on the active switch;
   performing a first dry etching and two ashing treatments on the active switch;
   performing a second wet etching on the active switch;
   performing a second dry etching on the active switch; and
   removing the photoresist;
   wherein the operation of providing a first photomask, and disposing a plurality of film layer materials for an active switch on the first substrate comprises:
   providing the first photomask to form a gate electrode on the first substrate;
   forming a gate insulating material layer, an active material layer, an ohmic contact material layer, a second metal material layer, and a photoresist material layer in sequence on the gate electrode;
   wherein the operation of providing a second photomask, disposing a photoresist on the active switch, and etching each of the plurality of film layer materials based on the photoresist to form the active switch comprises:
   providing the second photomask, forming a photoresist pattern on the second metal material layer that has a thickness corresponding to positions of a source electrode and a drain electrode greater than a thickness corresponding to a channel region, and etching the active material layer, the ohmic contact material, and the second metal material layer based on the photoresist pattern to form the active switch;
   wherein the operation of performing a first wet etching on the active switch comprises:
   performing a first wet etching on the second metal material layer, and etching away portions of the second metal material layer that are not covered by the photoresist;
   wherein the operation of performing a first dry etching and two ashing treatments on the active switch comprises:
   performing a first ashing treatment on the photoresist to flatten the portion of the photoresist corresponding to the channel region;
   performing a first dry etching on the active material layer, and etching away the portions of the active material layer that are not covered by the photoresist comprises:
   performing a second ashing treatment on the photoresist, etching away the portion of the photoresist corresponding to the channel region, and exposing the second metal material layer in the channel region;
   wherein the operation of performing a second wet etching on the active switch comprises:
   performing a second wet etching on the second metal material layer to form a source electrode and a drain electrode oppositely arranged across the channel region;
   wherein the operation of performing a second dry etching on the active switch comprises:
   performing a second dry etching, etching the ohmic contact material layer and the active material layer to form the ohmic contact layer and the active layer.

2. The method as recited in claim 1, wherein an ashing gas used in each of the first ashing treatment and the second ashing treatment is oxygen.

3. The method as recited in claim 2, wherein a flow rate of the first ashing treatment is 7000 Scc/min-9000 Scc/min, and a duration is 15 s-25 s; a flow rate of the second ashing treatment is 7000 Scc/min-9000 Scc/min, and a duration is 35 s-45 s.

4. The method as recited in claim 1, wherein an ashing gas used in the first ashing treatment is oxygen, and an ashing gas used in the second ashing treatment is mixed gas of oxygen and sulfur hexafluoride, wherein in the operation of the first ashing treatment, a flow rate of the oxygen is 7000 Scc/min-9000 Scc/min; in the operation of the second ashing treatment, a flow rate of feeding oxygen is 6000 Scc/min-12000 Scc/min, and the flow rate of feeding sulfur hexafluoride is 100 Scc/min-500 Scc/min;
   wherein a duration of the first ashing treatment is 15-25 s, and a duration of the second ashing treatment is 10-20 s.

5. The method as recited in claim 1, wherein the operation of providing a second photomask and forming a photoresist with a thickness corresponding to positions of the source electrode and the drain electrode on the second metal material layer greater than the thickness corresponding to the channel region comprises:
   providing a second photomask and forming a U-shaped photoresist pattern with a thickness of 1.4 um-1.6 um corresponding to the positions of the source and drain and a thickness of 0.4 um-0.6 um corresponding to the channel region on the second metal material layer;
   wherein the operation of performing a first ashing treatment on the active switch comprises:
   performing the first ashing treatment on the photoresist to thin the photoresist as a whole by 0.15 um-0.25 um;
   wherein the operation of performing a second ashing treatment on the photoresist comprises:
   performing a second ashing treatment on the photoresist to thin the photoresist by 0.25 um-0.35 um as a whole, so as to completely etch away the portion of the photoresist corresponding to the channel region to expose the channel.

6. The method as recited in claim 1, wherein an ashing gas used in each of the first ashing treatment and the second ashing treatment is a mixed gas of oxygen and sulfur hexafluoride;
   wherein in the operation of the first ashing treatment, a flow rate of feeding oxygen is 6000 Scc/min-12000 Scc/min, and a flow rate of feeding sulfur hexafluoride is 0 Scc/min-50 Scc/min; in the operation of the second ashing treatment, a flow rate of feeding oxygen is 6000 Scc/min-12000 Scc/min, and a flow rate of feeding sulfur hexafluoride is 100 Scc/min-500 Scc/min;
   wherein a duration of the first ashing treatment is 5-10 s, and a duration of the second ashing treatment is 10-20 s.

7. A method of manufacturing an array substrate, comprising:

providing a first substrate;
providing a first photomask, and forming a gate electrode on the first substrate;
forming a gate insulating material layer, an active material layer, an ohmic contact material layer, a second metal material layer, and a photoresist material layer in sequence on the gate electrode;
providing a second photomask and forming a U-shaped photoresist pattern with a thickness of 1.4 um-1.6 um corresponding to positions of a source electrode and a drain electrode and a thickness of 0.4 um-0.6 um corresponding to a channel region on the second metal material layer, and etching the active material layer, the ohmic contact material layer and the second metal material layer based on the photoresist pattern to form an active switch;
providing a third photomask and disposing a protective layer on the active switch; and
providing a fourth photomask, and disposing a pixel electrode layer on the protective layer;
wherein the operations of providing a second photomask and forming a U-shaped photoresist pattern with a thickness of 1.4 um-1.6 um corresponding to positions of a source electrode and a drain electrode and a thickness of 0.4 um-0.6 um corresponding to a channel region on the second metal material layer, and etching the active material layer, the ohmic contact material layer and the second metal material layer based on the photoresist pattern to form an active switch comprise:
performing a first wet etching on the second metal material layer, and etching away portions of the second metal material layer that are not covered by the photoresist;
performing a first ashing treatment on the photoresist, wherein oxygen is used as an ashing gas, and is fed at a flow rate of 8000 Scc/min, and the ashing treatment is performed for a duration of 20 s to thin the photoresist by 0.15 um-0.25 um to flatten the portion of the photoresist corresponding to the channel;
performing a first dry etching on the active material layer, and etching away the portions of the active material layer that are not covered by the photoresist;
performing a second ashing treatment on the photoresist, wherein a mixed gas of oxygen and sulfur hexafluoride is used as an ashing gas, wherein oxygen is fed at a flow rate of 8000 Scc/min, sulfur hexafluoride is fed at a flow rate of 100 Scc/min, and the ashing treatment is performed for a duration of 15 s to reduce an overall thickness of the photoresist by 0.25 um-0.35 um, so that the portion of the photoresist corresponding to the channel region is etched away to expose the second metal material layer in the channel region;
performing a second wet etching on the second metal material layer to form a source electrode and a drain electrode oppositely arranged across the channel region;
performing a second dry etching on the active material layer and the ohmic contact material layer, etching away the portion of the ohmic contact material layer corresponding to the channel region of to form an ohmic contact layer, and etching the portion of the active material layer corresponding to the channel position to form a groove thus creating an active layer; and
removing the photoresist;
wherein the second metal material layer has a three-layer structure, wherein a bottom layer is a molybdenum metal layer, a middle layer is an aluminum metal layer, and a top layer is a molybdenum nitride metal layer.

8. A method of manufacturing an array substrate, comprising:
providing a first substrate;
providing a first photomask, and disposing a plurality of film layer materials for an active switch on the first substrate;
providing a second photomask, disposing a photoresist on the active switch, and etching each of the plurality of film layer materials based on the photoresist to form the active switch;
providing a third photomask, and disposing a protective layer on the active switch; and
providing a fourth photomask, and disposing a pixel electrode layer on the protective layer;
wherein the operation of providing a second photomask, disposing a photoresist on the active switch, and etching each of the plurality of film layer materials based on the photoresist to form the active switch comprises:
performing a first wet etching on the active switch;
performing a first dry etching and two ashing treatments on the active switch;
performing a second wet etching on the active switch;
performing a second dry etching on the active switch; and
removing the photoresist;
wherein the operation of providing a first photomask, and disposing a plurality of film layer materials for an active switch on the first substrate comprises:
providing the first photomask to form a gate electrode on the first substrate;
forming a gate insulating material layer, an active material layer, an ohmic contact material layer, a second metal material layer, and a photoresist material layer in sequence on the gate electrode;
wherein the operation of providing a second photomask, disposing a photoresist on the active switch, and etching each of the plurality of film layer materials based on the photoresist to form the active switch comprises:
providing the second photomask, forming a photoresist pattern on the second metal material layer that has a thickness corresponding to positions of a source electrode and a drain electrode greater than a thickness corresponding to a channel region, and etching the active material layer, the ohmic contact material, and the second metal material layer based on the photoresist pattern to form the active switch;
wherein the operation of performing a first wet etching on the active switch comprises:
performing a first wet etching on the second metal material layer, and etching away portions of the second metal material layer that are not covered by the photoresist;
wherein the operation of performing a first dry etching and two ashing treatments on the active switch comprises:
performing a first dry etching on the active material layer, and etching away portions of the active material layer that are not covered by the photoresist;
performing a first ashing treatment on the photoresist to flatten the portion of the photoresist corresponding to the channel region;
performing a second ashing treatment on the photoresist, etching away the portion of the photoresist corresponding to the channel region, and exposing the second metal material layer in the channel region;

wherein the operation of performing a second wet etching on the active switch comprises:
performing a second wet etching on the second metal material layer to form a source electrode and a drain electrode oppositely arranged across the channel region;
wherein the operation of performing a second dry etching on the active switch comprises:
performing a second dry etching, etching the ohmic contact material layer and the active material layer to form the ohmic contact layer and the active layer.

9. The method as recited in claim 8, wherein an ashing gas used in each of the first ashing treatment and the second ashing treatment is oxygen.

10. The method as recited in claim 8, wherein an ashing gas used in the first ashing treatment is oxygen, and an ashing gas used in the second ashing treatment is mixed gas of oxygen and sulfur hexafluoride, wherein in the operation of the first ashing treatment, a flow rate of the oxygen is 7000 Scc/min-9000 Scc/min; in the operation of the second ashing treatment, a flow rate of feeding oxygen is 6000 Scc/min-12000 Scc/min, and a flow rate of feeding sulfur hexafluoride is 100 Scc/min-500 Scc/min;
wherein a duration of the first ashing treatment is 15-25 s, and a duration of the second ashing treatment is 10-20 s.

11. The method as recited in claim 8, wherein the operation of providing a second photomask and forming a photoresist with a thickness corresponding to the positions of the source electrode and the drain electrode on the second metal material layer greater than the thickness corresponding to the channel region comprises:
providing a second photomask and forming a U-shaped photoresist pattern with a thickness of 1.4 um-1.6 um corresponding to the positions of the source and drain and a thickness of 0.4 um-0.6 um corresponding to the channel region on the second metal material layer;
wherein the operation of performing a first ashing treatment on the active switch comprises:
performing the first ashing treatment on the photoresist to thin the photoresist as a whole by 0.15 um-0.25 um;
wherein the operation of performing a second ashing treatment on the photoresist comprises:
performing a second ashing treatment on the photoresist to thin the photoresist by 0.25 um-0.35 um as a whole, so as to completely etch away the portion of the photoresist corresponding to the channel region to expose the channel.

12. The method as recited in claim 8, wherein an ashing gas used in each of the first ashing treatment and the second ashing treatment is a mixed gas of oxygen and sulfur hexafluoride;
wherein in the operation of the first ashing treatment, a flow rate of feeding oxygen is 6000 Scc/min-12000 Scc/min, and a flow rate of feeding sulfur hexafluoride is 0 Scc/min-50 Scc/min; in the operation of the second ashing treatment, the flow rate of feeding oxygen is 6000 Scc/min-12000 Scc/min, and the flow rate of feeding sulfur hexafluoride is 100 Scc/min-500 Scc/min;
wherein a duration of the first ashing treatment is 5-10 s, and a duration of the second ashing treatment is 10-20 s.

13. The method as recited in claim 8, wherein a composition of an etching solution used in each of the first wet etching and the second wet etching is mainly a mixed liquid of: phosphoric acid or orthophosphoric acid; acetic acid; and nitric acid;
wherein an etching gas used in the first dry etching is a mixed gas of chlorine and sulfur hexafluoride; an etching gas used in the second dry etching is a mixture of sulfur hexafluoride, oxygen, and helium.

14. The method as recited in claim 12, wherein the first ashing treatment and the second ashing treatment are each performed under a power of 5000 W-15000 W and a temperature of 25° C.-60° C.

15. The method as recited in claim 12, wherein a ratio of the flow rate of the oxygen gas to the flow rate of sulfur hexafluoride is 8000:100.

16. The method as recited in claim 8, wherein the second metal material layer is a three-layer structure, wherein a bottom layer is a molybdenum metal layer, a middle layer is an aluminum metal layer, and a top layer is a molybdenum nitride metal layer.

* * * * *